United States Patent
Hatwar et al.

(10) Patent No.: US 7,288,330 B2
(45) Date of Patent: Oct. 30, 2007

(54) HIGH PERFORMANCE WHITE LIGHT-EMITTING OLED DEVICE

(75) Inventors: Tukaram K. Hatwar, Penfield, NY (US); Jeffrey P. Spindler, Rochester, NY (US); Ralph H. Young, Rochester, NY (US)

(73) Assignee: Eaastman Kodak Company, Rochester, NY (US)

( * ) Notice: Subject to any disclaimer, the term of this patent is extended or adjusted under 35 U.S.C. 154(b) by 453 days.

(21) Appl. No.: 10/882,834

(22) Filed: Jul. 1, 2004

(65) Prior Publication Data

US 2006/0003184 A1 Jan. 5, 2006

(51) Int. Cl.
*H01L 51/50* (2006.01)

(52) U.S. Cl. ............ 428/690; 428/917; 313/504; 313/506

(58) Field of Classification Search .......... 428/690, 428/917, 212; 313/504, 506; 257/102, 103
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,405,709 A | 4/1995 | Littman et al. | |
| 5,683,823 A | 11/1997 | Shi et al. | |
| 5,885,498 A | 3/1999 | Matsuo et al. | |
| 6,392,340 B2 | 5/2002 | Yoneda et al. | |
| 6,933,522 B2 * | 8/2005 | Lin et al. | 257/40 |
| 2001/0053462 A1 * | 12/2001 | Mishima | 428/690 |
| 2004/0058193 A1 | 3/2004 | Hatwar | |
| 2004/0066139 A1 * | 4/2004 | Hamada et al. | 313/506 |
| 2004/0124766 A1 * | 7/2004 | Nakagawa et al. | 313/504 |
| 2005/0181232 A1 * | 8/2005 | Ricks et al. | 428/690 |
| 2007/0035238 A1 * | 2/2007 | Nakagawa et al. | 313/504 |

FOREIGN PATENT DOCUMENTS

| | | |
|---|---|---|
| EP | 1 187 235 A2 | 3/2002 |
| JP | 07-142169 | 6/1995 |
| JP | 2001-052870 | 12/1999 |

OTHER PUBLICATIONS

Kido et al., Science, 267, (1995), p. 1332-1334.
Kido et al., Applied Physics Letters, 64, (1994), p. 815-817.
Deshpande et al., Applied Physics Letters, 75, (1999), p. 888-890.

* cited by examiner

*Primary Examiner*—Dawn Garrett
(74) *Attorney, Agent, or Firm*—Raymond L. Owens

(57) ABSTRACT

A broadband-emitting OLED device having an anode and a cathode spaced from the anode includes a first light-emitting layer provided over the anode and containing a first host material and a first light-emitting material, wherein the first host material is a mixture of one or more mono-anthracene derivatives and one or more aromatic amine derivatives, wherein the mono-anthracene derivative(s) being provided in a volume fraction range of 5% to 50% relative to the total host volume, and the aromatic amine derivative(s) being provided in a volume fraction range of 50% to 95% relative to the total host volume, and a second light-emitting layer provided over or under the first light-emitting layer.

12 Claims, 1 Drawing Sheet

HIGH PERFORMANCE WHITE LIGHT-EMITTING OLED DEVICE

CROSS REFERENCE TO RELATED APPLICATIONS

Reference is made to commonly assigned U.S. patent application Ser. No. 10/780,436, now Publication No. 2005/0181232 published Aug. 18, 2005, commonly assigned U.S. patent application Ser. No. 10/801,997, now Publication No. 2005/0208327, commonly assigned U.S. patent application Ser. No. 10/838,665 now Publication No. 2005/0249972, commonly assigned U.S. patent application Ser. No. 10/869,115 now Publication No. 2005/0280008.

FIELD OF THE INVENTION

The present invention relates to white light-emitting organic light-emitting diode (OLED) devices comprising light-emitting layers containing a host and a dopant.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full color flat emission displays. Tang et al. described this multilayer OLED device in their U.S. Pat. Nos. 4,769,292 and 4,885,211.

There is a continuing need for efficient, stable, robust formulations for broadband light-emitting OLED devices. By broadband light, it is meant that the OLED emits sufficient light throughout the spectrum so that such light can be used in conjunction with filters to produce a full color display. In particular, there is a need for white light-emitting OLEDs where there is substantial emission in the red, green, and blue portions of the spectrum, wherein a white emitting electroluminescent (EL) layer can be used to form a multicolor device. Each pixel is coupled with a color filter element as part of a color filter array (CFA) to achieve a pixilated multicolor display. The organic EL layer is common to all pixels and the final color as perceived by the viewer is dictated by that pixel's corresponding color filter element. Therefore, a multicolor or RGB device can be produced without requiring any patterning of the organic EL layers. An example of a white CFA top emitting device is shown in U.S. Pat. No. 6,392,340.

White light producing OLED devices should be bright, efficient, and generally have 1931 Commission Internationale d'Eclairage (CIE) chromaticity coordinates, (CIE x, CIE y), of about (0.33, 0.33). The following patents and publications disclose the preparation of OLED devices capable of producing white light, comprising a hole-transporting layer and an organic luminescent layer, and interposed between a pair of electrodes.

White light producing OLED devices have been reported by J. Shi (U.S. Pat. No. 5,683,823) wherein the luminescent layer includes red and blue light-emitting materials uniformly dispersed in a host emitting material. Sato et al. in JP 07-142169 discloses an OLED device, capable of emitting white light, made by forming a blue light-emitting layer next to the hole-transporting layer and followed by a green light-emitting layer having a region containing a red fluorescent layer.

Kido et al., in *Science,* 267, 1332 (1995) and in *Applied Physics Letters,* 64, 815 (1994), report a white light-producing OLED device. In this device, three emitter layers with different carrier transport properties, each emitting blue, green, or red light, are used to produce white light. Littman et al. in U.S. Pat. No. 5,405,709 disclose another white emitting device, which is capable of emitting white light in response to hole-electron recombination, and comprises a fluorescent in a visible light range from bluish green to red. More recently, Deshpande et al., in *Applied Physics Letters,* 75, 888 (1999), published a white OLED device using red, blue, and green luminescent layers separated by a hole-blocking layer.

As illustrated above, a common approach to the construction of a white light producing OLED device is to combine layers with different emission spectra. A frequent problem with such combinations is that the relative intensities of emission of the different layers may vary with the current density, resulting in an overall emission spectrum and emission color that also vary with current density. Such current dependences require complicated algorithms to adjust the intensities of differently colored pixels to achieve a desired overall emission color.

Kobori et al., in Unexamined Patent Application JP 2001-52870, teach the use of a host comprising a mixture of an anthracene derivative and an aromatic amine for a blue light-emitting layer and, if present, other light-emitting layers. They disclose a white light-emitting OLED having two light-emitting layers constructed in this manner. In the examples disclosed, both light-emitting layers include a mixture of an aromatic amine and a bisanthracene compound in a 25%/75% ratio as a host. The first light-emitting layer (which is closer to the anode) includes a rubrene derivative as a yellow light-emitting material doped into the host in a few percent. To make white light, a second light-emitting layer (closer to the cathode) is provided on the first light-emitting layer. The second light-emitting layer uses an arylamine-substituted styrene derivative as the blue light-emitting compound doped into the host. In the example, an electron-transporting layer is provided over the second light-emitting layer, an alkali metal halide electron-injecting layer (CsI) disposed over the electron-transporting layer, and a Mg:Ag alloy cathode deposited over the CsI.

Although the OLED disclosed in JP 2001-52870 provides an adequate white color with effective lifetime, it is not a robust formulation. For example, merely removing the alkali metal halide electron-injecting layer results in a dramatic shift to yellow emission, with 90% or more of the emission coming from the first light-emitting layer. This also resulted in a significant decrease in efficiency and lifetime. Further, it was indicated that the decrease in lifetime was especially large for the blue. It is known in the art that an Mg:Ag cathode provides effective performance without an alkali metal halide layer. Such a dramatic shift in performance based solely on the presence or absence of an alkali metal halide layer is unacceptable from a manufacturing perspective. This indicates that the color, efficiency, and lifetime of this structure are very sensitive to the electron-injecting properties of the OLED. In manufacturing, an OLED formulation should be robust to variables that can arise in the manufacturing process. Some of these variables relate to manufacturing tolerances and can include chemical composition variations, thickness variations, variations in electron- and hole-injecting properties, and so forth. Some other variables relate to degrees of freedom in selection of processes and materials, including the cathode. For various reasons (reflectivity, conductivity, ease of manufacture) may need to change the cathode, but without reformulating the device.

U.S. Pat. No. 5,885,498 discloses the use of symmetric anthracene compounds such as 9,10-diphenylanthracene (DPA) doped into a high Tg (glass transition temperature) hole-transporting layer at low concentrations, wherein the DPA emits light. It is alleged that such a device has higher efficiency and a reduced number of black spots that form upon keeping. It does not disclose that such a mixture is useful as a host material.

SUMMARY OF THE INVENTION

It is therefore an object of the present invention to provide an improved broadband organic light-emitting device wherein the broadband radiation can include light substantially in the white portion of the spectrum.

This object is achieved by a broadband-emitting OLED device having an anode and a cathode spaced from the anode, comprising:

a) a first light-emitting layer provided over the anode and containing a first host material and a first light-emitting material, wherein the first host material is a mixture of one or more mono-anthracene derivatives and one or more aromatic amine derivatives, wherein the mono-anthracene derivative(s) being provided in a volume fraction range of 5% to 50% relative to the total host volume, and the aromatic amine derivative(s) being provided in a volume fraction range of 50% to 95% relative to the total host volume; and b) a second light-emitting layer provided over or under the first light-emitting layer.

ADVANTAGES

It is an advantage of this invention that the color and efficiency are insensitive to normal manufacturing variations. It is a further advantage of this invention that the emission color and efficiency are not affected by use of different cathode materials, different electron-injecting materials, or the presence or absence of an electron-injecting layer. It is yet a further advantage of this invention that the emission color is hardly affected by the current density at which the device is driven.

Figure 1:
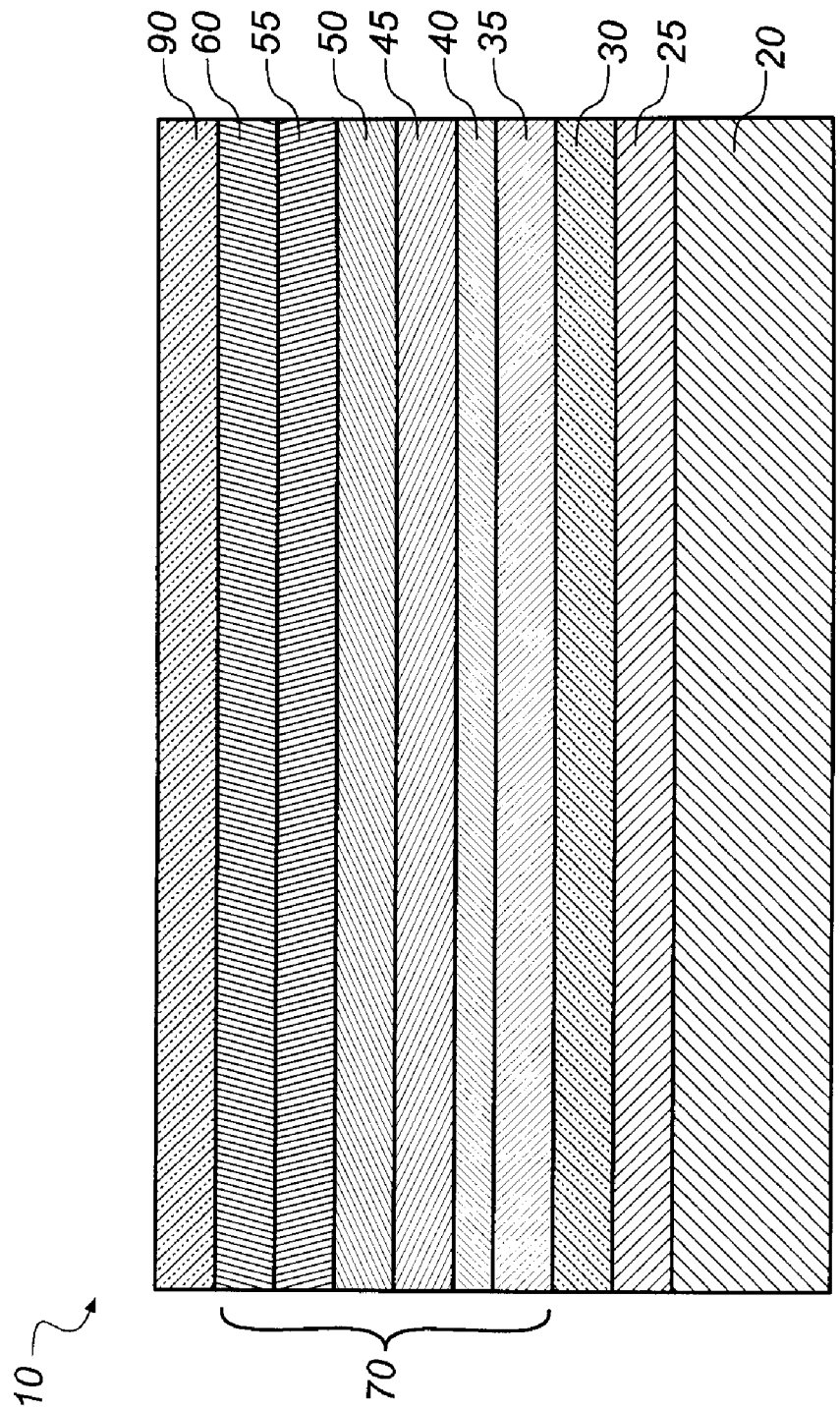
FIG. 1 is a cross-sectional view of an OLED device according to a first embodiment of this invention.

Since device feature dimensions such as layer thicknesses are frequently in submicrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in combination of hues. The red, green, and blue colors constitute the three primary colors from which other colors can be produced by appropriate mixing. The term "hue" refers to the intensity profile of light emission within the visible spectrum, with different hues exhibiting visually discernible differences in color. The pixel is generally used to designate the smallest addressable unit in a display panel.

In accordance with this disclosure, broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a multicolor or full color display. Although CIEx, CIEy coordinates of about 0.33, 0.33 can be ideal in some circumstances, the actual coordinates can vary significantly and still be very useful.

Turning now to FIG. 1, there is shown a cross-sectional view of a pixel of a light-emitting OLED device 10 that can be used according to a first embodiment of the present invention. The OLED device 10 is a broadband-emitting OLED device, and can be a white light-emitting OLED device, and includes at a minimum a substrate 20, an anode 30, a cathode 90 spaced from anode 30, a first light-emitting layer 45, and a second light-emitting layer 50. The first and second light-emitting layers emit different color light. If white light emission is desired, the first and second light-emitting layers typically emit complementary, or nearly complementary colors. The combination of light emission between the two light-emitting layers of a white light-emitting OLED device should cover most of the visible spectrum in order to produce useful white light. For example, the first light-emitting layer can emit yellow and the second light-emitting layer can emit blue. Other combinations such as red and cyan are possible. The OLED device 10 can also include color filter 25, a hole-injecting layer 35, a hole-transporting layer 40, an electron-transporting layer 55, and an electron-injecting layer 60. Hole-injecting layer 35, hole-transporting layer 40, light-emitting layers 45 and 50, electron-transporting layer 55, and electron-injecting layer 60 are organic layers that comprise organic EL element 70 that is disposed between anode 30 and cathode 90 and that, for the purposes of this invention, includes at least two different dopants for collectively emitting broadband light. These components will be described in more detail.

Substrate 20 can be an organic solid, an inorganic solid, or include organic and inorganic solids. Substrate 20 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 20 can be a homogeneous mixture of materials, a composite of materials, or multiple layers of materials. Substrate 20 can be an OLED substrate, that is a substrate commonly used for preparing OLED devices, e.g. active matrix low temperature polycrystalline silicon or amorphous-silicon TFT substrate. The substrate 20 can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, ceramics, and circuit board materials, or any others commonly used in the formation of OLED devices, which can be either passive matrix devices or active matrix devices.

An electrode is formed over substrate 20 and is most commonly configured as an anode 30. However, the OLED devices of this invention are not limited to this configuration, and can instead have a cathode as the first electrode. For the purposes of this discussion, the electrode adjacent to the substrate is considered the anode. When EL emission is viewed through the substrate 20, anode 30 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable way such as evaporation, sputtering, chemical vapor deposition, or electrochemical means. Anode materials can be patterned using well known photolithographic processes.

Cathode 90 is formed over the electron-transporting layer 55 or over light-emitting layer 50 if an electron-transporting layer is not used. When light emission is through the anode 30, the cathode material can be comprised of nearly any conductive material. Desirable materials have effective film-forming properties to ensure effective contact with the underlying organic layer, promote electron injection at low voltage, and have effective stability. Useful cathode materials often contain a low work function metal (<3.0 eV) or metal alloy. One preferred cathode material is comprised of a Mg:Ag alloy wherein the percentage of silver is in the range of 1% to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through cathode 90, it should be transparent or nearly transparent. For such applications, metals should be thin or one should use transparent conductive oxides, or include these materials. Optically transparent cathodes have been described in more detail in U.S. Pat. Nos. 5,776,623 and 6,548,956. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 90 is spaced, meaning it is vertically spaced apart from anode 30. Cathode 90 can be part of an active matrix device and in that case is a single electrode for the entire display. Alternatively, cathode 90 can be part of a passive matrix device, in which each cathode 90 can activate a column of pixels, and cathodes 90 are arranged orthogonal to anodes 30.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

First and second light-emitting layers 45 and 50, respectively, produce light in response to hole-electron recombination and are commonly disposed over hole-transporting layer 40, although hole-transporting layer 40 is not required for the practice of this invention. Desired organic light-emitting materials can be deposited by any suitable way such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, each of the light-emitting layers of the organic EL element includes a luminescent or fluorescent material where electroluminescence is produced as a result of electron-hole pair recombination in this region. It is also possible for recombination in one light-emitting layer to produce luminescence in another light-emitting layer by way of an energy transfer process. While light-emitting layers can be comprised of a single material, they more commonly include a host material doped with a guest compound or dopant where light emission comes primarily from the dopant. The practice of this invention concerns such host/dopant light-emitting layers and OLED devices. The dopant is selected to produce color light having a particular spectrum. The dopant is usually chosen from highly fluorescent dyes, and is typically coated as 0.01 to 10% by weight into the host material.

An important relationship for choosing a dye as a dopant is the value of the optical bandgap, which is defined the energy difference between the emissive excited state and the ground state of the molecule and is approximately equal to the energy difference between the lowest unoccupied molecular orbital and the highest occupied molecular orbital of the molecule. For efficient energy transfer from the host material to the dopant molecule, or to prevent back-transfer of energy from the dopant to the host, a necessary condition is that the band gap of the dopant be smaller than that of the host material.

Emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; 6,020,078; and 6,534,199.

First light-emitting layer 45 is provided over anode 30 and includes a first host material and a first light-emitting material. The first host material is a mixture of one or more mono-anthracene derivatives provided in a volume fraction range of 5% to 50% relative to the total host volume, and one or more aromatic amine derivatives provided in a volume fraction range of 50% to 95% relative to the total host volume.

The mono-anthracene derivative(s) in first light-emitting layer 45 can be derivatives of a single anthracene nucleus having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

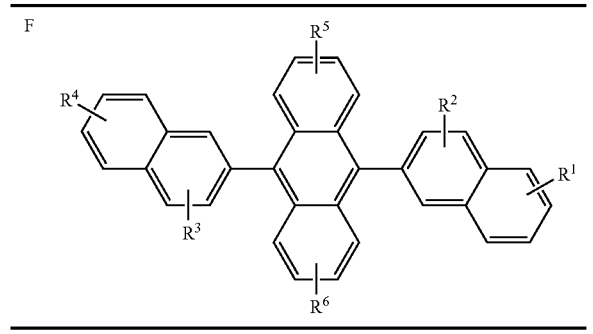

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

The mono-anthracene derivative of Formula (I) is also a useful host material capable of supporting electroluminescence, and is particularly suitable for light emission of wavelengths longer than 400 nm, e.g., blue, green, yellow, orange or red. Mono-anthracene derivatives of Formula (I) are described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference

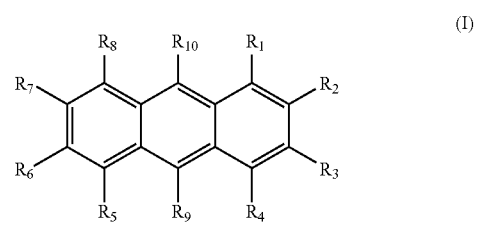

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that it forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Some examples of useful mono-anthracene materials for use in a light-emitting layer include:

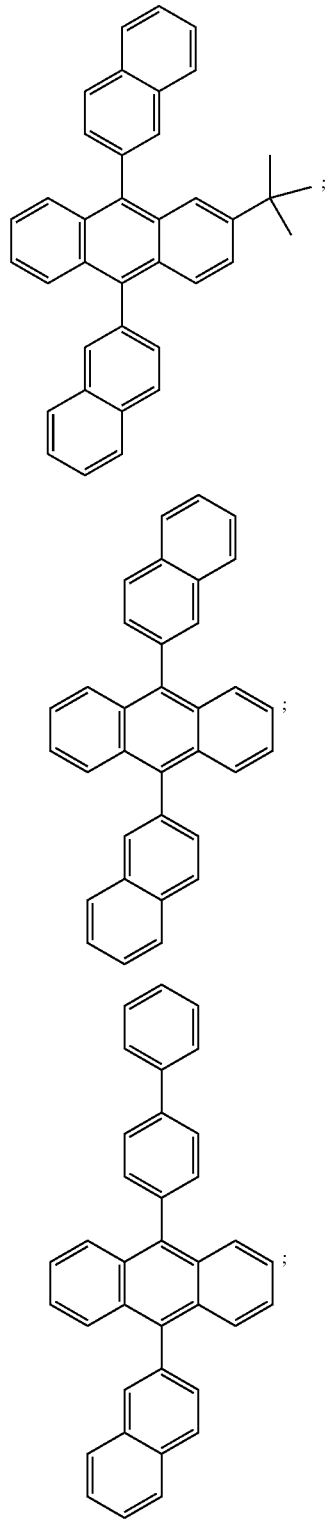

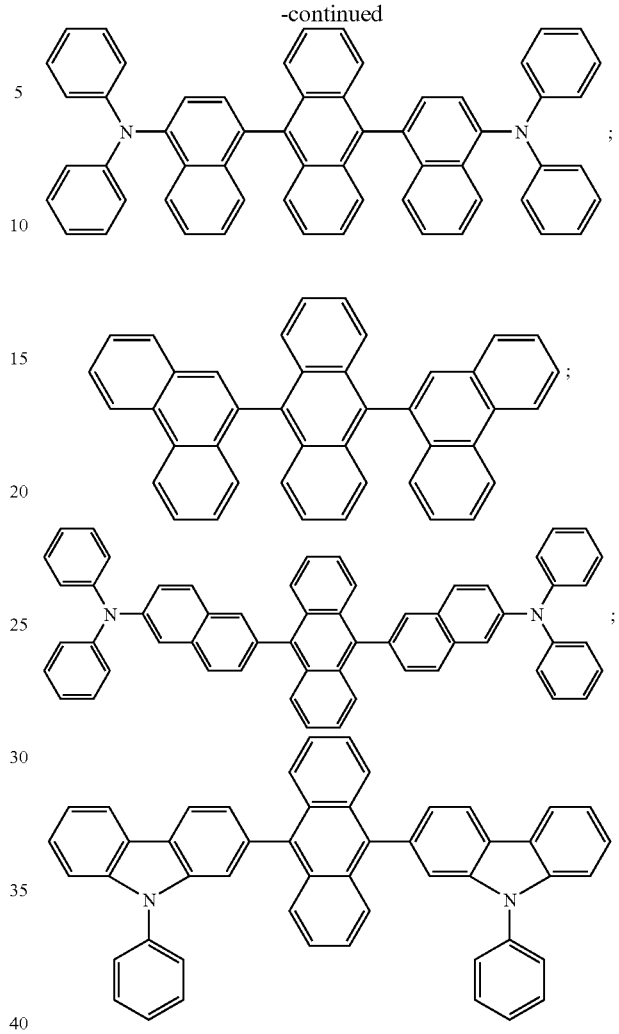

The aromatic amine derivative can be any such amine that has hole-transporting properties. Hole-transporting layers and materials will be further described below. Some examples of aromatic amine derivatives that can be used in first light-emitting layer 45 include the following:
1,1-Bis(4-di-p-tolylaminophenyl)cyclohexane;
1,1-Bis(4-di-p-tolylaminophenyl)-4-phenylcyclohexane;
4,4'-Bis(diphenylamino)quaterphenyl;
Bis(4-dimethylamino-2-methylphenyl)-phenylmethane;
Tri(p-tolyl)amine;
4-(di-p-tolylamino)-4'-[4'-(di-p-tolylamino)-1-styryl]stilbene;
N,N,N',N'-Tetra-p-tolyl-4,4'-diaminobiphenyl;
N,N,N',N'-Tetraphenyl-4,4'-diaminobiphenyl;
N-Phenylcarbazole;
Poly(N-vinylcarbazole);
N,N'-di-1-naphthalenyl-N,N'-diphenyl-4,4'-diaminobiphenyl;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4"-Bis[N-(1-naphthyl)-N-phenylamino]-p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;

4,4''-Bis[N-(1-anthryl)-N-phenylamino]p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4''-diamino-p-terphenyl;
4,4'-Bis {N-phenyl-N-[4-(1-naphthyl)-phenyl]amino}biphenyl;
4,4'-Bis[N-phenyl-N-(2-pyrenyl)amino]biphenyl;
2,6-Bis[N,N-di(2-naphthyl)amino]fluorene; and
1,5-Bis[N-(1-naphthyl)-N-phenylamino]naphthalene.

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrylium and thiapyrylium compounds, derivatives of distryrylbenzene or distrylbiphenyl, bis(azinyl)methane boron complex compounds, and carbostyryl compounds. Illustrative examples of useful dopants include, but are not limited to, the following:

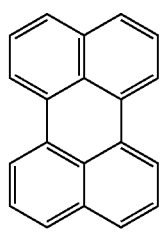

L1

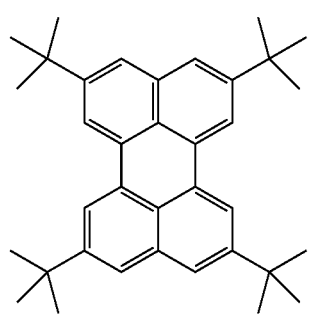

L2

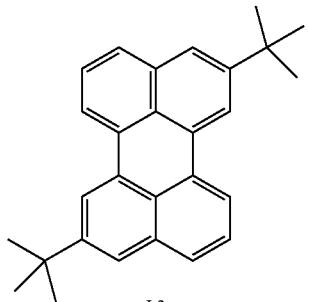

L3

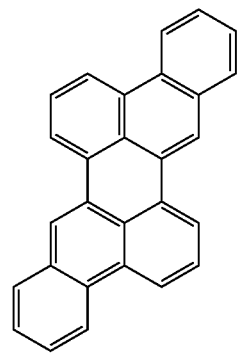

L4

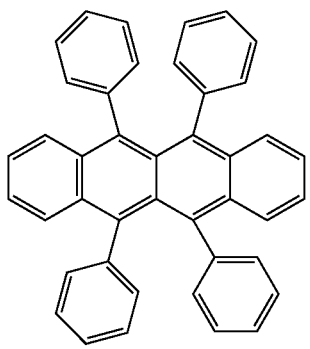

L5

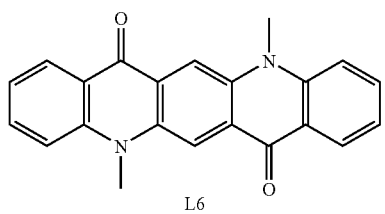

L6

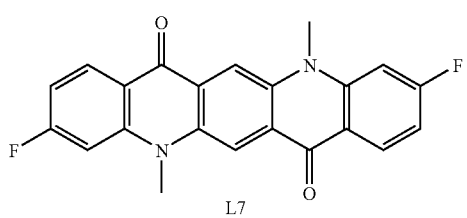

L7

-continued

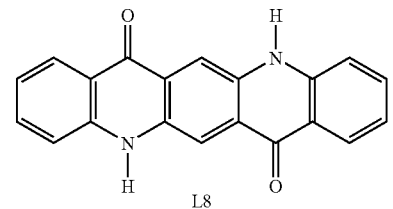

L8

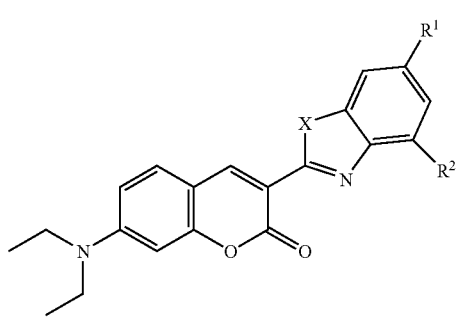

|  | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

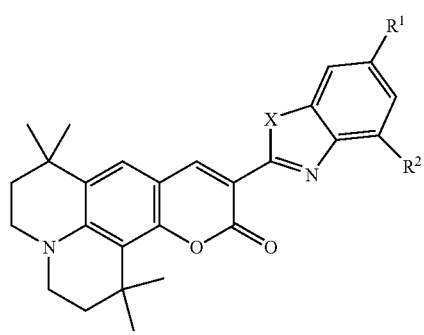

|  | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

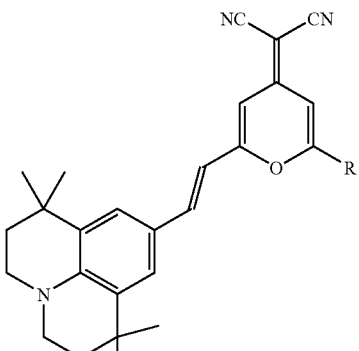

|  | R |
|---|---|
| L37 | phenyl |
| L38 | methyl |
| L39 | t-butyl |
| L40 | mesityl |

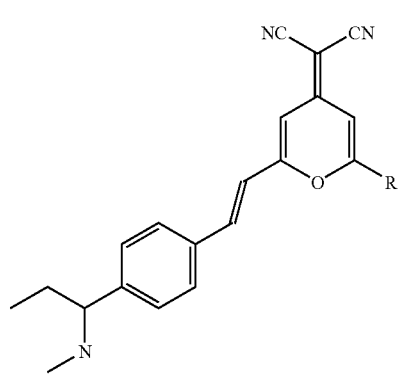

|  | R |
|---|---|
| L41 | phenyl |
| L42 | methyl |
| L43 | t-butyl |
| L44 | mesityl |

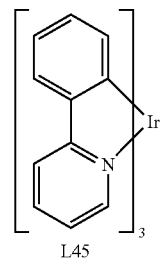

L45

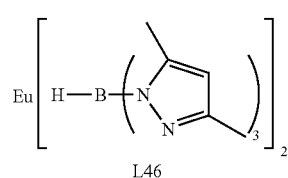

L46

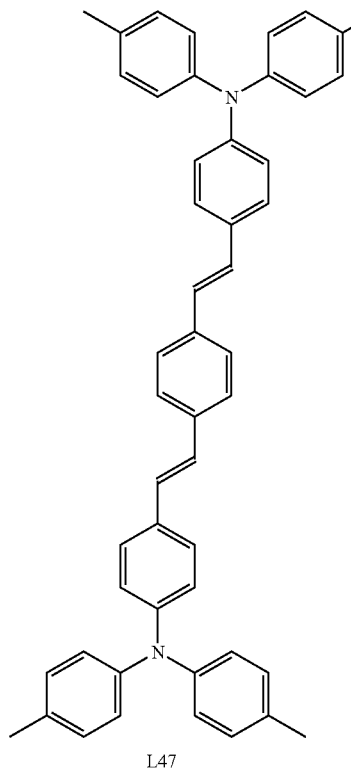

L47

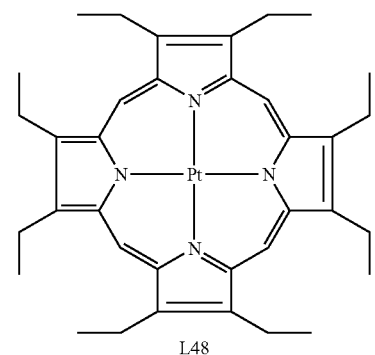

L48

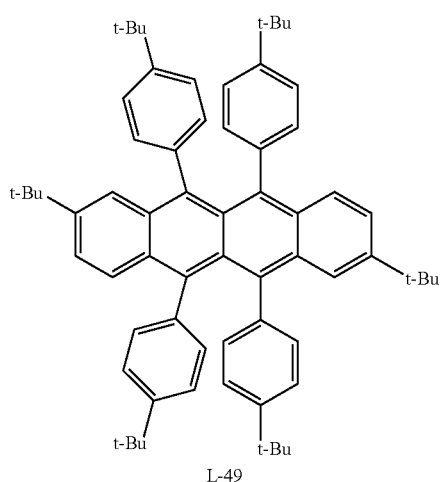

L-49

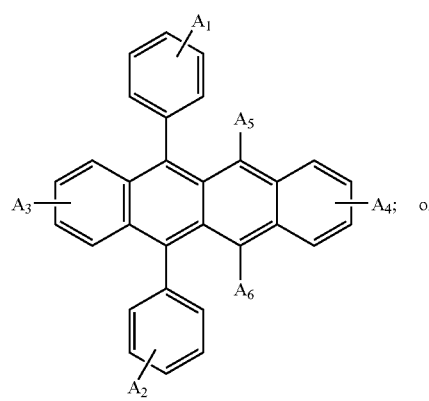

L50

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

First light-emitting layer 45 includes a first light-emitting material. In a preferred embodiment, first light-emitting layer 45 can have a peak emission in the yellow to red portion of the visible spectrum, and therefore the first light-emitting material can be a light-emitting yellow, orange, or red dopant. A light-emitting yellow dopant can include a compound of the following structures:

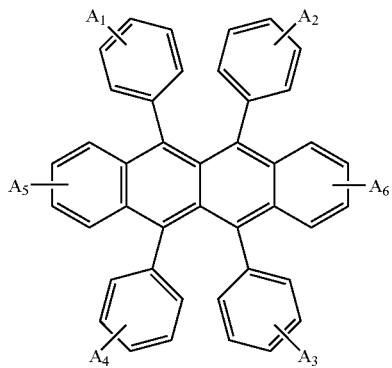

P2 wherein $A_1$-$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow dopants include 5,6,11,12-tetraphenylnaphthacene (rubrene); 6,11-diphenyl-5,12-bis(4-(6-methylbenzothiazol-2-yl)phenyl)naphthacene (DBzR) and 5,6,11,12-tetra(2-naphthyl)naphthacene (NR), the formulas of which are shown below:

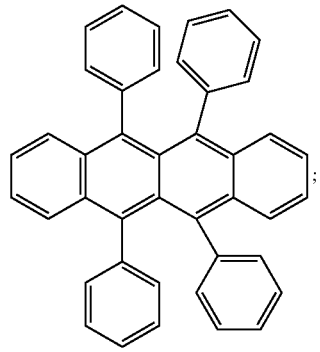

(Rubrene, P3)

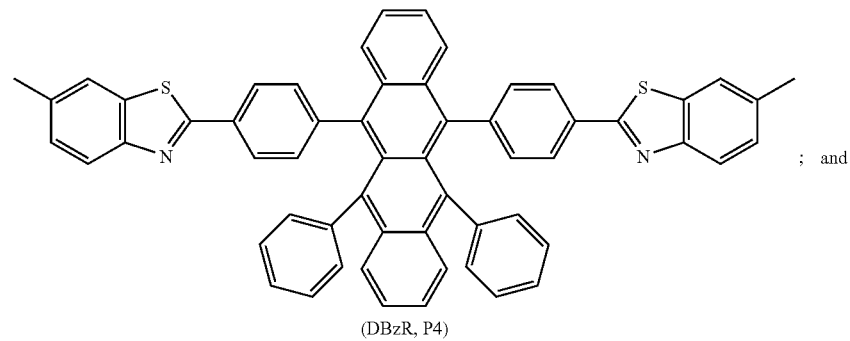

(DBzR, P4)

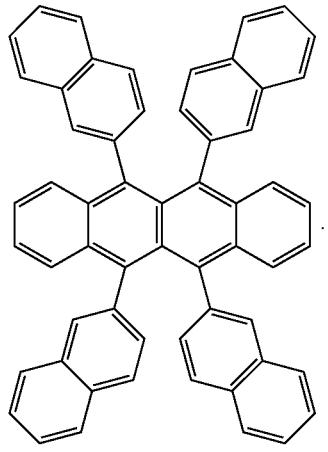

(NR, P5)

A suitable yellow dopant can also be a mixture of compounds that would also be yellow dopants individually.

A suitable light-emitting red dopant can include a diindenoperylene compound of the following structure Q1:

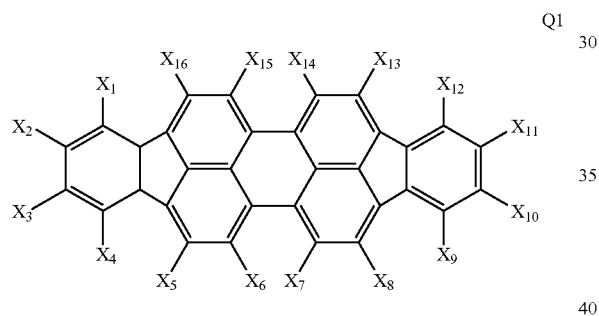

Q1 wherein $X_1$-$X_{16}$ are independently selected as hydro or substituents that provide red luminescence.

Illustrative examples of useful red dopants of this class include the following:

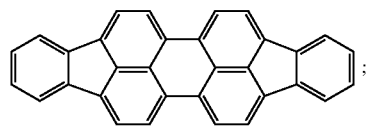

periflanthene, Q2

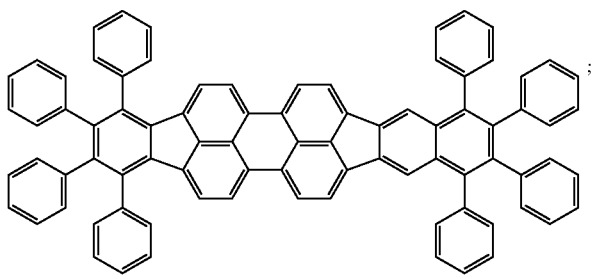

Q3

-continued
Q4
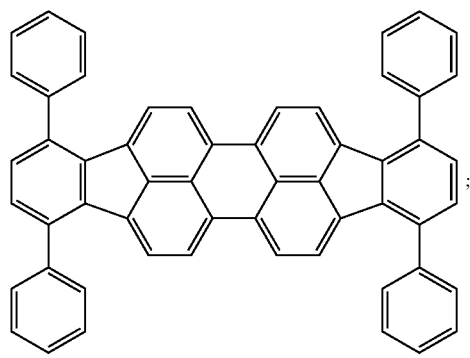;
Q5
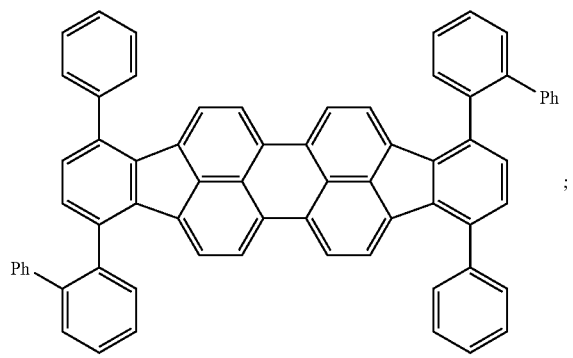;
Q6
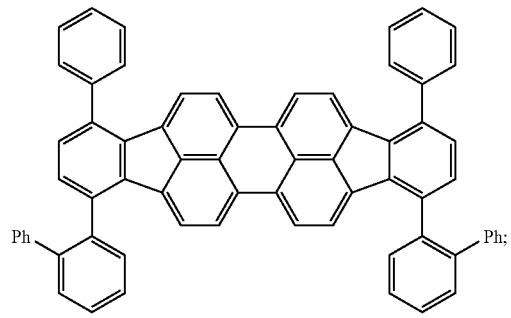;
Q7
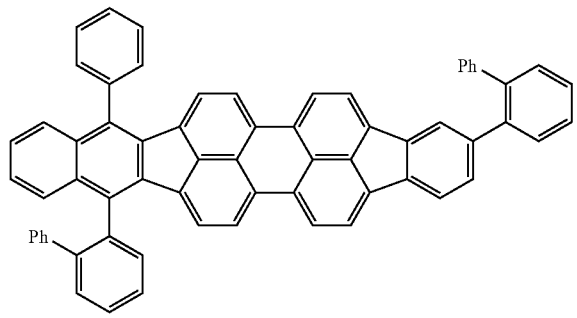;
Q8
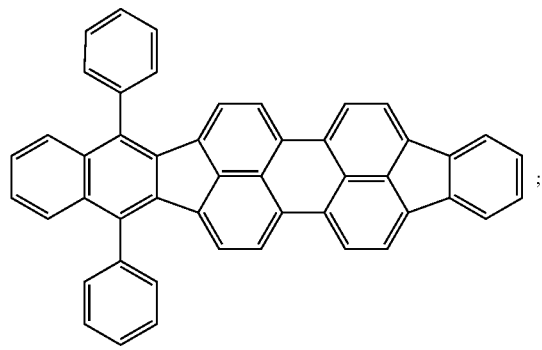;
Q9
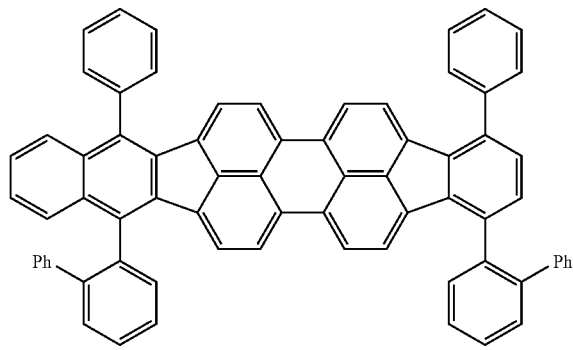;
TPDBP, Q10
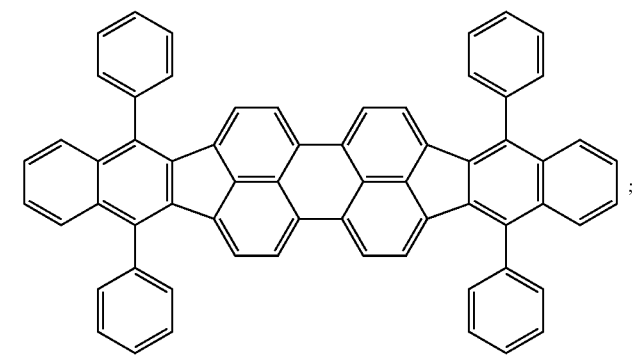;

-continued
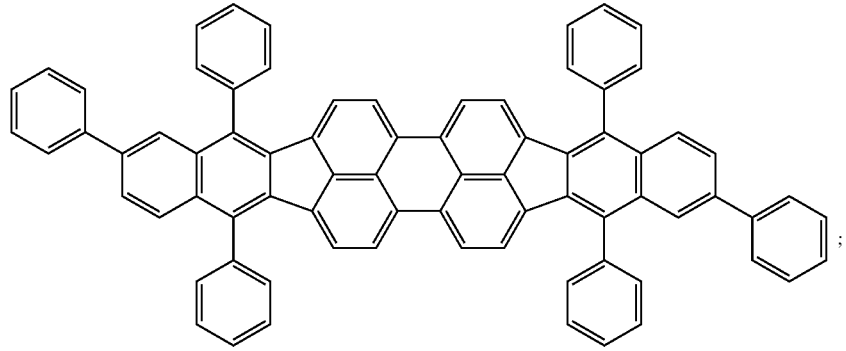
Q11
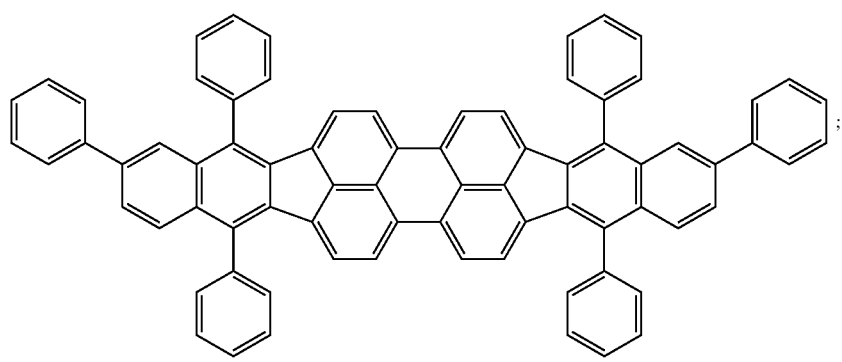
Q12
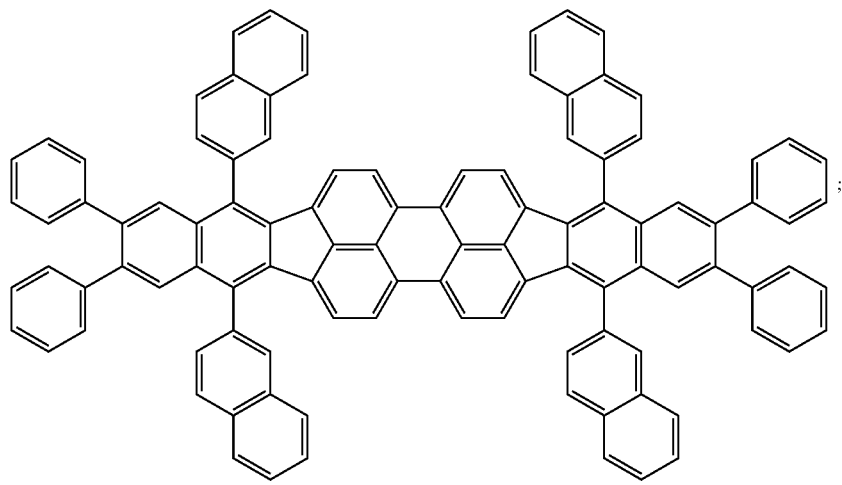
Q13

-continued
Q14
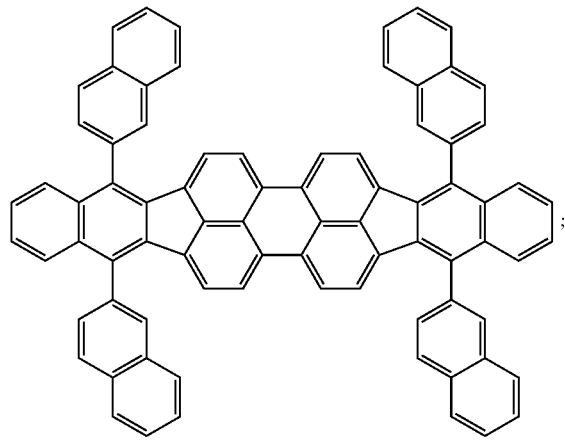
Q15
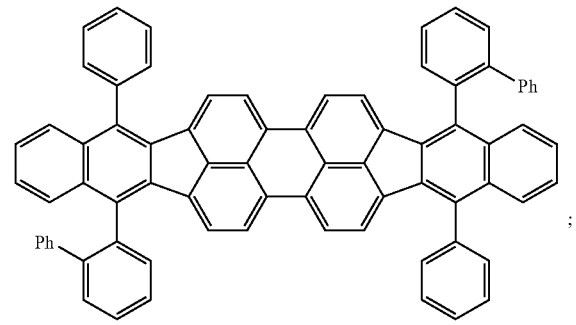
Q16
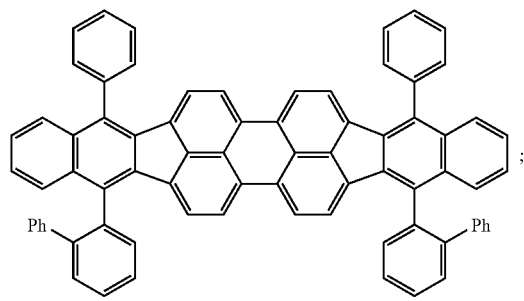
Q17
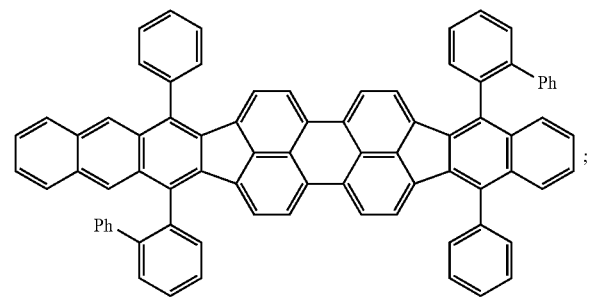
Q18
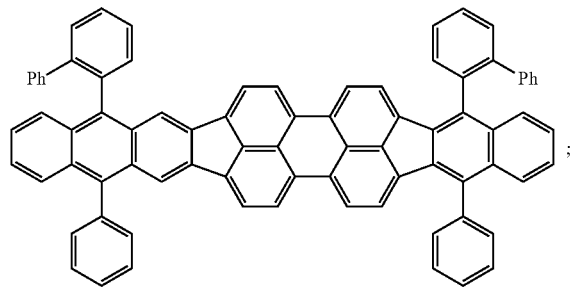
Q19
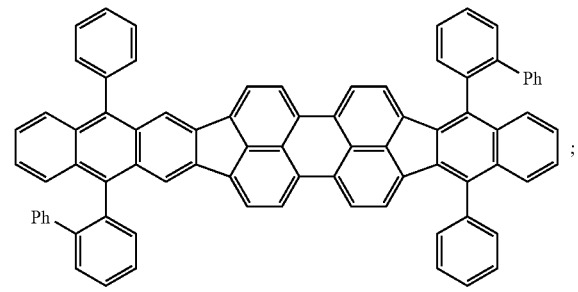
Q20
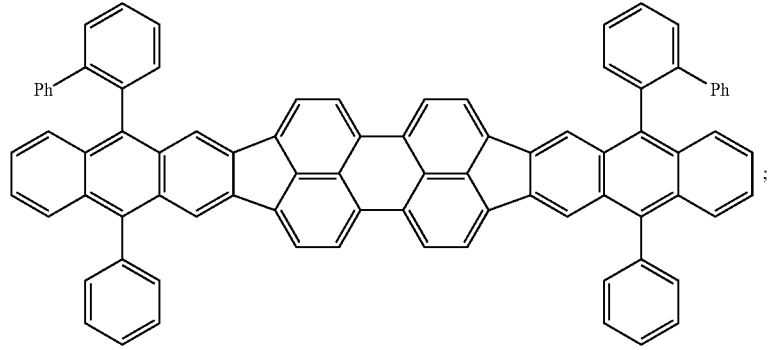

-continued
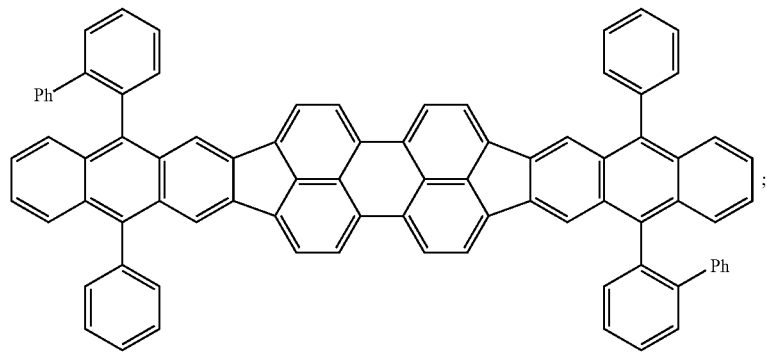
Q21
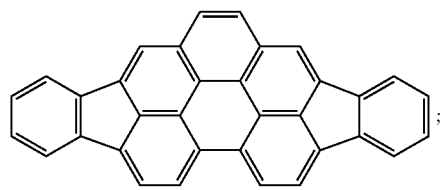
Q22
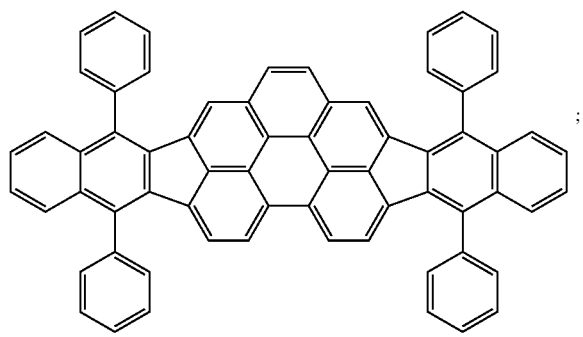
Q23
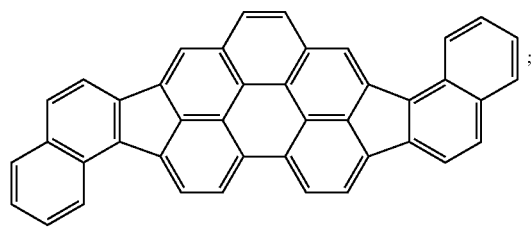
Q24
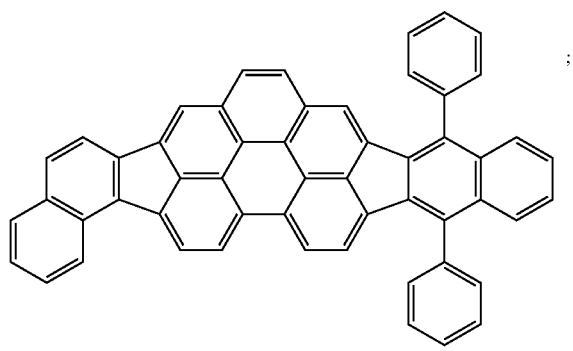
Q25
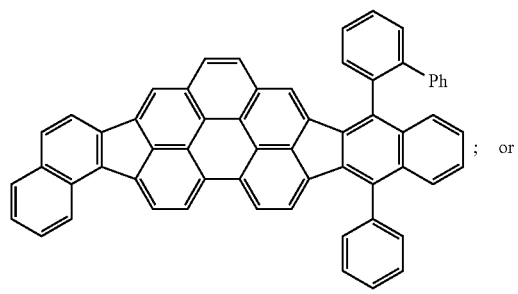
Q26 ; or
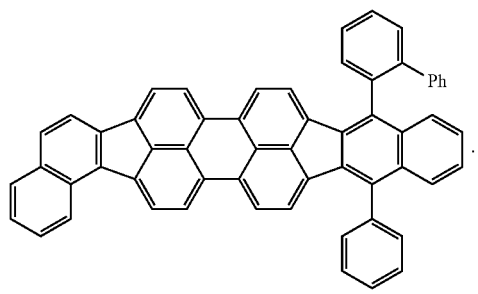
Q27

A particularly preferred diindenoperylene dopant is dibenzo {[f,f']-4,4'7,7'-tetraphenyl]diindeno-[1,2,3-cd:1',2', 3'-lm]perylene (TPDBP, Q10 above).

Other red dopants useful in the present invention belong to the DCM class of dyes represented by Formula S1:

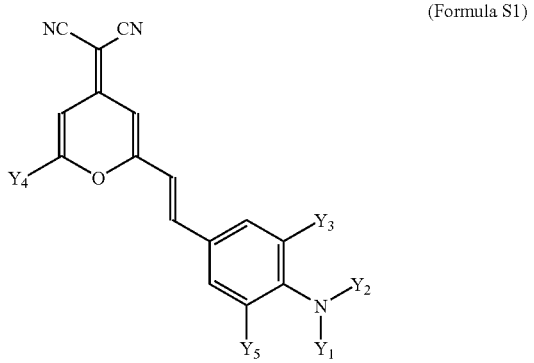

(Formula S1)

wherein:
  $Y_1$-$Y_5$ represent one or more groups independently selected from hydro, alkyl, substituted alkyl, aryl, or substituted aryl; and
  $Y_1$-$Y_5$ independently include acyclic groups or are joined pairwise to form one or more fused rings, provided that $Y_3$ and $Y_5$ do not together form a fused ring.

In a useful and convenient embodiment that provides red luminescence, $Y_1$-$Y_5$ are selected independently from hydro, alkyl and aryl. Structures of particularly useful dopants of the DCM class are shown below:

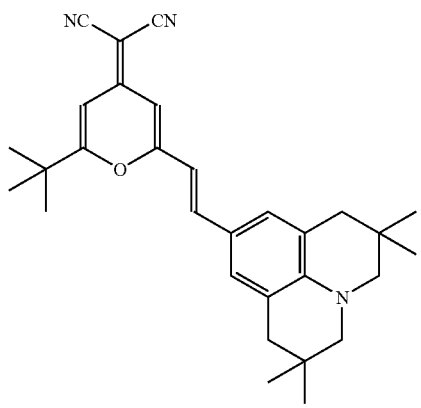

S2, DCJTB

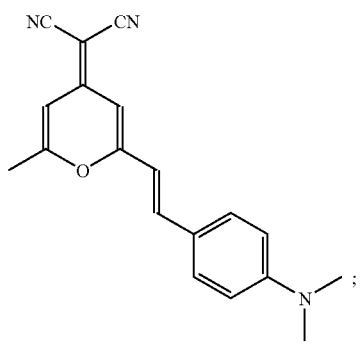

S3

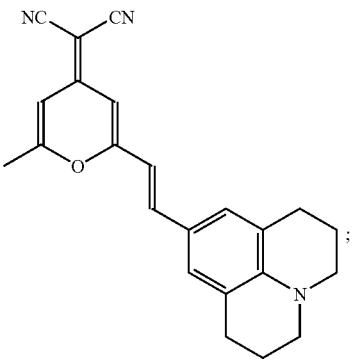

S4

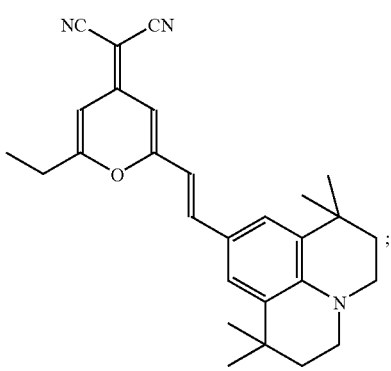

S5

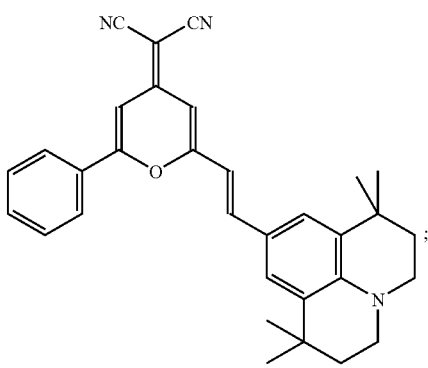

L37

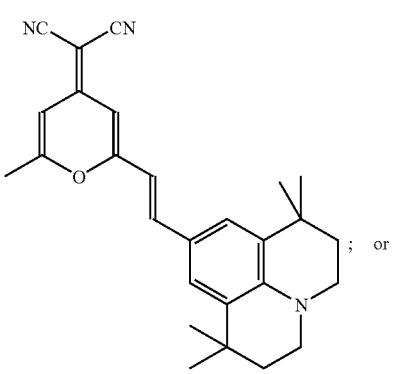

L38

-continued

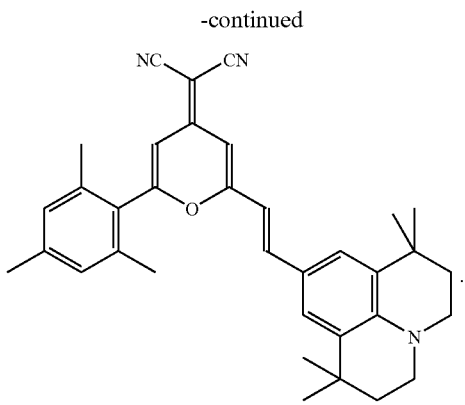

L40

A preferred DCM dopant is DCJTB. A useful red dopant can also be a mixture of compounds that would also be red dopants individually.

Second light-emitting layer 50 is provided over or under first light-emitting layer 45. Second light-emitting layer 50 can have a peak emission in the blue to cyan portion of the spectrum, so that white light is produced by the combined emission of the two light-emitting layers when the first light-emitting layer has a peak emission in the yellow to red portion of the spectrum. Second light-emitting layer 50 includes a second host material and a second light-emitting material. In one embodiment, the second host material is one or more mono-anthracene derivatives, wherein the mono-anthracene derivatives are selected from the same potential mono-anthracene derivatives as for first light-emitting layer 45. The mono-anthracene derivative(s) selected for second light-emitting layer 50 can be the same as or different from those selected for first light-emitting layer 45.

In another embodiment, the second host material can include a mixture of one or more mono-anthracene derivatives provided in a volume fraction range of greater than 85% to less than 100% relative to the total host volume, and one or more aromatic amine derivatives provided in a volume fraction range of greater than 0% to less than 15% relative to the total host volume. The mono-anthracene derivatives are selected from the same mono-anthracene derivative candidates, and the aromatic amine derivatives from the same aromatic amine derivative candidates, as for first light-emitting layer 45. The mono-anthracene derivative(s) selected for second light-emitting layer 50 can be the same as or different from those selected for first light-emitting layer 45. Likewise, the aromatic amine derivative(s) selected for second light-emitting layer 50 can be the same as or different from those selected for first light-emitting layer 45.

Although Kobori et al., in Unexamined Patent Application JP 2001-52870, teach the use of a host comprising a mixture of an anthracene derivative and an aromatic amine, they clearly teach that this is to be done in the blue light-emitting layer, as well as any other light-emitting layers that are present. In addition, one is led to the conclusion that the same host is to be used in all light-emitting layers. While this gives improved stability, it is not a robust formulation, as discussed above. Kobori et al. give no indication that the use of different hosts in the various light-emitting layers can improve the robustness of the device. Further, by teaching that the mixed host is to be incorporated into the blue light-emitting layer, they give no indication that the use of such a mixed host in only a yellow-light-emitting layer can give improved robustness without sacrificing improved stability. Further, the examples used give no indication that by changing the ratio of anthracene to amine one can improve the robustness of the device.

The second light-emitting material can be a light-emitting blue dopant and can include perylene or derivatives thereof, blue-emitting derivatives of distyrylbenzene or a distyryl-biphenyl that have one or more aryl amine substituents, or a compound of the structure M1:

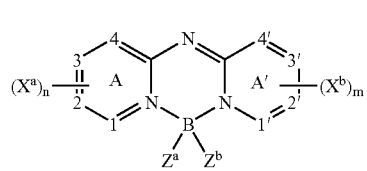

M1 wherein:
A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Some examples of the above class of dopants include the following:

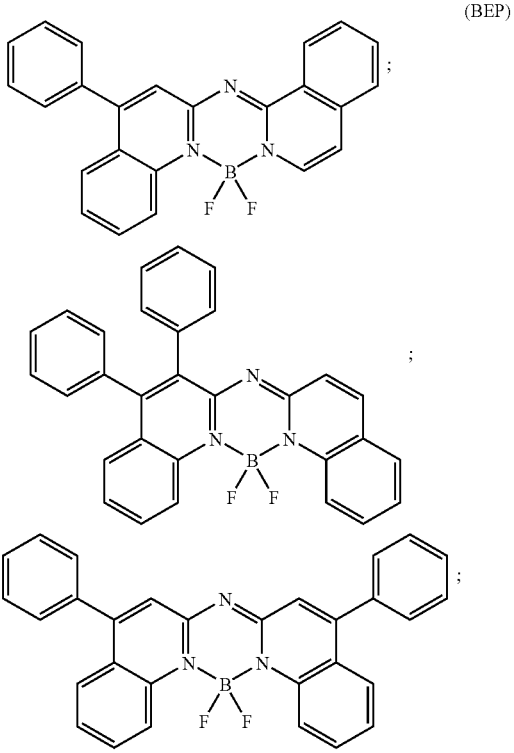

(BEP)

-continued

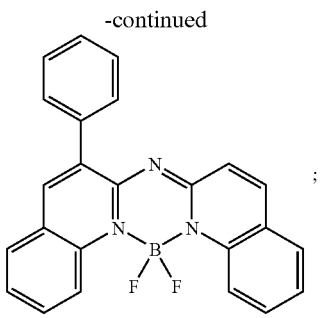

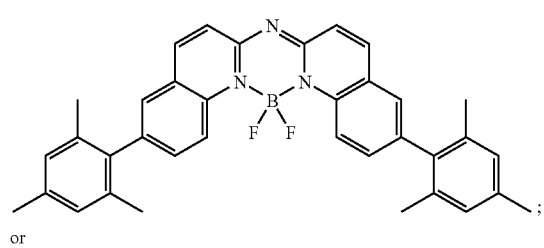

or

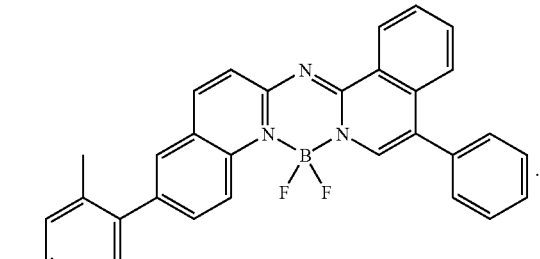

Another particularly useful class of blue dopants includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]benzenes of the general structure N1 shown below:

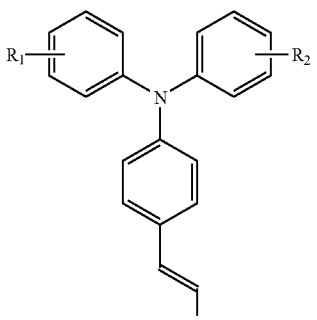

N1

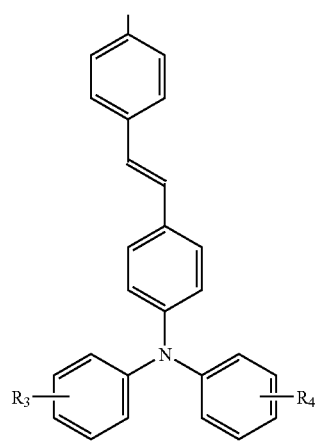

and bis[2-[4-[N,N-diarylamino]phenyl]vinyl]biphenyls of the general structure N2 shown below:

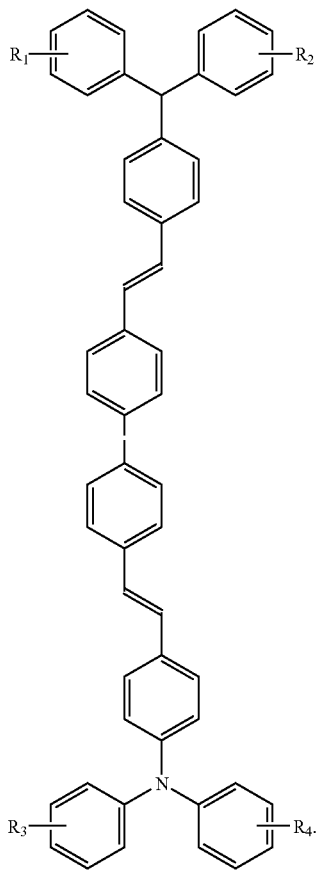

N2

In Formulas N1 and N2, $R_1$-$R_4$ can be the same or different, and individually represent one or more substituents such as alkyl, aryl, fused aryl, halo, or cyano. In a preferred embodiment, $R_1$-$R_4$ are individually alkyl groups, each containing from one to about ten carbon atoms. A particularly preferred blue dopant of this class is 1,4-bis[2-[4-[N,N-di(p-tolyl)amino]phenyl]vinyl]benzene (BD-TAPVB, Formula L47 above).

The color filter 25 includes color filter elements for the color to be emitted from the pixel of OLED device 10 and is part of a color filter array that is combined with organic EL element 70. Color filter 25 is constructed to pass a preselected color of light in response to white light, so as to produce a preselected color output. An array of three different kinds of color filters 25 that pass red, green, and blue light, respectively, is particularly useful in a full color OLED device. Several types of color filters are known in the art. One type of color filter 25 is formed on a second transparent substrate and then aligned with the pixels of the first substrate 20. An alternative type of color filter 25 is formed directly over the elements of the pixel of OLED device 10. In a display comprising multiple pixels, the space between the individual color filter elements can also be filled with a black matrix (not shown) to reduce pixel cross talk and improve the display's contrast. While color filter 25 is shown here as being located between anode 30 and substrate 20, it can alternatively be located on the outside surface of substrate 20. For a top emitting device, color filter 25 can be located over cathode 90. Alternatively, the color filters can be replaced with color change media (CCM). Color change media absorb light of one wavelength and emit light of a longer wavelength by fluorescence. Commonly, a CCM layer absorbs blue or green light and emits green or red. CCM layers can be used in conjunction with color filters.

While not always necessary, it is often useful that a hole-injecting layer 35 be formed over anode 30 in an organic light-emitting display. The hole-injecting material can serve to improve the film formation property of subsequent organic layers and to facilitate injection of holes into the hole-transporting layer. Suitable materials for use in hole-injecting layer 35 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide ($VO_x$), molybdenum oxide ($MoO_x$), and nickel oxide ($NiO_x$). Alternative hole-injecting materials reportedly useful in organic EL devices are described in EP 0 891 121 A1 and EP 1 029 909 A1.

While not always necessary, it is often useful that a hole-transporting layer 40 be formed and disposed over anode 30. Desired hole-transporting materials can be deposited by any suitable way such as evaporation, sputtering, chemical vapor deposition, electrochemical means, thermal transfer, or laser thermal transfer from a donor material. Hole-transporting materials useful in hole-transporting layer 40 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines is those which include at least two aromatic tertiary amine moieties as described in U.S. Pat. Nos. 4,720,432 and 5,061,569. Such compounds include those represented by structural Formula A

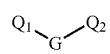

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene moiety. When G is an aryl group, it is conveniently a phenylene, biphenylene, or naphthalene moiety.

A useful class of triarylamines satisfying structural Formula A and containing two triarylamine moieties is represented by structural Formula B

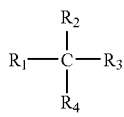

where:
R₁ and R₂ each independently represent a hydrogen atom, an aryl group, or an alkyl group or R₁ and R₂ together represent the atoms completing a cycloalkyl group; and
R₃ and R₄ each independently represent an aryl group, which is in turn substituted with a diaryl substituted amino group, as indicated by structural Formula C

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by Formula C, linked through an arylene group. Useful tetraaryldiamines include those represented by Formula D

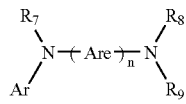

wherein:
each Are is an independently selected arylene group, such as a phenylene or anthracene moiety;
n is an integer of from 1 to 4; and
Ar, R₇, R₈, and R₉ are independently selected aryl groups.

In a typical embodiment, at least one of Ar, R₇, R₈, and R₉ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halides such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compound(s). Specifically, one can employ a triarylamine, such as a triarylamine satisfying the Formula B, in combination with a tetraaryldiamine, such as indicated by Formula D. Useful aromatic tertiary amines include those listed as being useful in first light-emitting layer 45 above.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

While not always necessary, it is often useful that OLED device 10 includes an organic layer disposed over light-emitting layers 45 and 50, wherein the organic layer includes an electron-transporting material, e.g. electron-transporting layer 55. Desired electron-transporting materials can be deposited by any suitable way such as evaporation, sputtering, chemical vapor deposition, electrochemical means, thermal transfer, or laser thermal transfer from a donor material. Preferred electron-transporting materials for use in electron-transporting layer 55 are metal chelated oxinoid compounds, including chelates of oxine itself (also commonly referred to as 8-quinolinol or 8-hydroxyquinoline). Such compounds help to inject and transport electrons and both exhibit high levels of performance and are readily fabricated in the form of thin films. Exemplary of contemplated oxinoid compounds are those satisfying structural Formula E

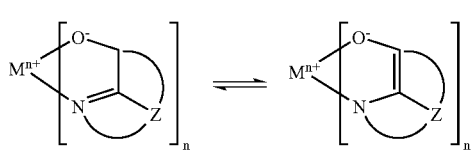

wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as beryllium, magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato) aluminum(III)];
CO-2: Magnesium bisoxine [alias, bis(8-quinolinolato) magnesium(II)];
CO-3: Bis[benzo{f}-8-quinolinolato]zinc (II);
CO-4: Bis(2-methyl-8-quinolinolato)aluminum(III)-μ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];

CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

In some embodiments of this invention, it is useful to add a mono-anthracene derivative to electron-transporting layer 55, wherein the mono-anthracene derivative is present in an amount up to 50% by volume. The mono-anthracene derivative is selected from the same mono-anthracene derivative candidates as for first and second light-emitting layers 45 and 50. The mono-anthracene derivative selected for electron-transporting layer 55 can be the same as or different from those selected for the light-emitting layers.

It will be understood that, as is common in the art, some of the layers can have more than one function. Light-emitting layers 45 and 50 can have hole-transporting properties or electron-transporting properties as desired for performance of the OLED device. Hole-transporting layer 40 or electron-transporting layer 55, or both, can also have emitting properties. In such a case, fewer layers than described above can be sufficient for the desired emissive properties, or additional useful emissive properties can be obtained with the use of additional emissive layers. For example, electron-transporting layer 55 can include a light-emitting material, thereby providing a third light-emitting layer. This third light-emitting layer can have a peak emission in the yellow to green portion of the spectrum. Such a device can provide white light with a red first light-emitting layer 45, a blue second light-emitting layer 50, and a green light-emitting electron-transporting layer 55. Such a light-emitting electron-transporting layer can also include a mono-anthracene derivative as described above for additional stabilizing effects.

The organic EL media materials mentioned above are suitably deposited through a vapor-phase method including evaporation, sublimation, sputtering, chemical vapor deposition, and thermal transfer from a donor element. Organic EL media materials can alternatively be deposited from a fluid, for example, from a solvent with an optional binder to improve film formation. Deposition from a fluid can be done in many ways including, but not limited to ink-jet, spin coating, curtain coating, spray coating, and electrochemical deposition. If the material is a polymer, solvent deposition is usually preferred, but other methods can be used, including sputtering, electrochemical deposition, electrophoretic deposition or thermal transfer from a donor sheet. The material to be deposited by evaporation or sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can use separate sublimation boats or the materials can be premixed and coated from a single boat or donor sheet.

An electron-injecting layer 60 can also be present between the cathode and the electron-transporting layer. Examples of electron-injecting materials include alkali or alkaline earth metals, alkali halide salts, such as LiF mentioned above, or alkali or alkaline earth metal doped organic layers.

In another embodiment of the present invention, the OLED device has a microcavity structure. In this case, both the anode and the cathode are metallic. One is essentially opaque and reflective; the other one is reflective and semi-transparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have an ITO spacer layer placed between a reflective anode and the organic EL media, with a semi-transparent cathode over the organic EL media.

There are numerous configurations of the organic EL media layers wherein the present invention can be successfully practiced. Examples of organic EL media layers that produce white light are described, for example, in EP 1 187 235, U.S. Patent Application Publication 2002/0025419, EP 1 182 244, and U.S. Pat. Nos. 5,683,823, 5,503,910, 5,405,709, and 5,283,182. As shown in EP 1 187 235, a white light-emitting organic EL element with a substantially continuous spectrum in the visible region of the spectrum can be achieved by providing at least two different dopants for collectively emitting white light, e.g. by the inclusion of the following layers:

a hole-injecting layer disposed over the anode;
a hole-transporting layer that is disposed over the hole-injecting layer and is doped with a light-emitting yellow dopant for emitting light in the yellow region of the spectrum;
a blue light-emitting layer including a host material and a light-emitting blue dopant disposed over the hole-transporting layer; and
an electron-transporting layer.

EXAMPLES

The invention and its advantages can be better appreciated by the following inventive and comparative examples. In the following, mixed compositions are described in terms of percentages or ratios by volume, as are commonly used in the art.

Example 1 (Comparative)

A comparative OLED device was constructed in the following manner:
1. A clean glass substrate was vacuum-deposited with indium tin oxide (ITO) to form a transparent electrode of 85 nm thickness;
2. The above-prepared ITO surface was treated with a plasma oxygen etch, followed by plasma deposition of a 0.5 nm layer of a fluorocarbon polymer (CFx) as described in U.S. Pat. No. 6,208,075;
3. The above-prepared substrate was further treated by vacuum-depositing a 240 nm layer of 4,4'-bis[N-(1-naphthyl)-N-phenylamino]biphenyl (NPB) as a hole-transporting layer (HTL);
4. A 20 nm layer of NPB (as host) with 2.5% 5,11-bis (biphenyl-4-yl)-6,12-bis(4-tert-butylphenyl)-3,9-di-tert-butylnaphthacene (as dopant) was vacuum-deposited onto the substrate at a coating station that included a heated graphite boat source to form a yellow emitting first light-emitting layer (yellow layer);

5. A coating of 40 nm of 9-(1-naphthyl)-10-(biphenyl-4-yl)anthracene (as host) with 2.5% 4-(di-p-tolylamino)-4'-[(di-p-tolylamino)styryl]stilbene (as dopant) was evaporatively deposited on the above substrate to form a blue emitting second light-emitting layer (blue layer);

6. A 15 nm layer of tris(8-quinolinolato)aluminum (III) (ALQ) was vacuum-deposited onto the substrate at a coating station that included a heated graphite boat source to form an electron-transporting layer;

7. A 200 nm cathode layer was deposited onto the electron-transporting layer at a coating station with separate tantalum boats, one of which contained silver and one of which contained magnesium. The cathode layer was a 10:1 atomic ratio of magnesium and silver; and 8. The device was then transferred to a dry box for encapsulation.

Example 2 (Inventive)

An inventive OLED device was constructed as in Example 1, except that in step 4 the host was a 90:10 mixture of NPB and 9-(1-naphthyl)-10-(biphenyl-4-yl)anthracene.

Example 3 (Inventive)

An inventive OLED device was constructed as in Example 1, except that in step 4 the host was an 80:20 mixture of NPB and 9-(1-naphthyl)-10-(biphenyl-4-yl)anthracene.

Example 4 (Inventive)

An inventive OLED device was constructed as in Example 1, except that in step 4 the host was a 50:50 mixture of NPB and 9-(1-naphthyl)-10-(biphenyl-4-yl)anthracene.

Example 5 (Comparative)

A comparative OLED device was constructed as in Example 1, except that in step 4 the host was a 25:75 mixture of NPB and 9-(1-naphthyl)-10-(biphenyl-4-yl)anthracene.

Example 6 (Comparative)

A comparative OLED device was constructed as in Example 1, except that in step 4 the host was 100% 9-(1-naphthyl)-10-(biphenyl-4-yl)anthracene.

Results (Examples 1-6)

The devices were tested by applying a current across the electrodes of 20 mA/cm$^2$ and measuring the spectrum. The relative luminous efficiency is defined as the luminous efficiency of the example device, in cd/A, divided by the luminous efficiency in, cd/A, of reference Example 1. The relative drive voltage is defined, similarly, as the drive voltage of the example device divided by the drive voltage of reference Example 1. CIE x and CIE y The CIE change magnitude is the magnitude of the color change in CIE color space relative to reference Example 1. The devices were tested at 1 mA/cm$^2$ and at 40 mA/cm$^2$ and the spectrum measured to determine the CIE color change due to varying current. For stability testing, the devices were run (aged) at 20 mA/cm$^2$ at 70° C. for 500 hours, after which the luminance relative to 0 hours was measured, and the spectrum measured. The following table shows the results.

TABLE 1

| Example: | 1 | 2 | 3 | 4 | 5 | 6 |
|---|---|---|---|---|---|---|
| Type (Inventive or Comparative) | Comp | Inv | Inv | Inv | Comp | Comp |
| % Mono-anthracene in yellow layer | 0 | 10 | 20 | 50 | 75 | 100 |
| Relative Drive voltage | 1.00 | 1.00 | 0.99 | 1.00 | 0.99 | 1.32 |
| Relative Luminous Efficiency | 1.00 | 1.03 | 1.03 | 1.16 | 1.21 | 0.58 |
| CIE x | 0.26 | 0.27 | 0.28 | 0.33 | 0.36 | 0.43 |
| CIE y | 0.40 | 0.41 | 0.41 | 0.44 | 0.44 | 0.43 |
| CIE change magnitude with respect to the comparison | — | 0.01 | 0.02 | 0.08 | 0.11 | 0.17 |
| CIE x change from 1 to 40 mA/cm$^2$ | 0.02 | 0.02 | 0.025 | 0.03 | 0.07 | 0.02 |
| CIE y change from 1 to 40 mA/cm$^2$ | 0.01 | 0.016 | 0.02 | 0.022 | 0.07 | 0.02 |
| Relative luminance after aging | 68% | 75% | 80% | 85% | 87% | 70% |
| CIE x after aging | 0.26 | 0.26 | 0.28 | 0.32 | 0.36 | 0.41 |
| CIE y after aging | 0.40 | 0.41 | 0.41 | 0.44 | 0.44 | 0.43 |

In these examples, 9-(1-naphthyl)-10-(biphenyl-4-yl)anthracene serves as the mono-anthracene derivative in the first light-emitting layer and NPB serves as the aromatic amine derivative. As can be seen in the above table, the addition of a mono-anthracene derivative to the yellow layer results in a major improvement in the stability, a significant increase in the luminous efficiency, no significant change in the drive voltage, and only a modest effect on the color. The greater stability implies a longer operating lifetime. However, the addition of a mono-anthracene derivative to the yellow light-emitting layer in the quantities of the examples of Kobori et al. (that is, 75% anthracene as in Example 5) shows an undesirable dependence of the color on the current density (color shift). The use of lower ratios of mono-anthracene derivative to aromatic amine derivative (Examples 2 to 4) according to the present invention produces a color that is nearly independent of current density and yields an increase in the luminous efficiency while preserving the improvement in the stability of the device. These examples also show that the mono-anthracene derivative/aromatic amine derivative combination can be used effectively in the yellow light-emitting layer without being present in the blue light-emitting layer. These examples also show that as much as 50% of the mono-anthracene derivative produces improved performance, whereas a larger amount, 75%, leads to an undesirable color shift.

Example 7 (Comparative)

A comparative OLED device was constructed in the following manner:
1. A clean glass substrate was vacuum-deposited with ITO to form a transparent electrode of 85 nm thickness;
2. The above-prepared ITO surface was treated with a plasma oxygen etch, followed by plasma deposition of a 0.5 nm layer of $CF_x$;
3. The above-prepared substrate was further treated by vacuum-depositing a 240 nm layer of NPB as a hole-transporting layer (HTL);
4. A 20 nm layer of NPB (as host) with 2.5% 5,11-bis(biphenyl-4-yl)-6,12-bis(4-tert-butylphenyl)-3,9-di-tert-butylnaphthacene (as dopant) was vacuum-deposited onto the substrate at a coating station that included a heated graphite boat source to form a yellow emitting first light-emitting layer (yellow layer);
5. A coating of 40 nm of 9-(1-naphthyl)-10-(biphenyl-4-yl)anthracene with 2.5% 4-(di-p-tolylamino)-4'-[(di-p-tolylamino)styryl]stilbene was evaporatively deposited on the above substrate to form a blue emitting second light-emitting layer (blue layer);
6. A 15 nm layer of ALQ was vacuum-deposited onto the substrate at a coating station that included a heated graphite boat source to form an electron-transporting layer;
7. A 200 nm cathode layer was deposited onto the electron-transporting layer at a coating station with separate tantalum boats, one of which contained silver and one of which contained magnesium. The cathode layer was a 10:1 atomic ratio of magnesium and silver; and
8. The device was then transferred to a dry box for encapsulation.

Example 8 (Inventive)

An inventive OLED device was constructed as in Example 7, except that in step 4 the host was a 90:10 mixture of NPB and 9-(1-naphthyl)-10-(biphenyl-4-yl)anthracene.

Example 9 (Inventive)

An inventive OLED device was constructed as in Example 7, except that in step 4 the host was a 60:40 mixture of NPB and 9-(1-naphthyl)-10-(biphenyl-4-yl)anthracene.

Example 10 (Inventive)

An inventive OLED device was constructed as in Example 7, except that in step 6 the electron-transporting layer comprised a 90:10 mixture of ALQ and 9-(1-naphthyl)-10-(biphenyl-4-yl)anthracene.

Example 11 (Inventive)

An inventive OLED device was constructed as in Example 7, except that in step 4 the host was a 90:10 mixture of NPB and 9-(1-naphthyl)-10-(biphenyl-4-yl)anthracene, and in step 6 the electron-transporting layer comprised a 90:10 mixture of ALQ and 9-(1-naphthyl)-10-(biphenyl-4-yl)anthracene.

Example 12 (Inventive)

An inventive OLED device was constructed as in Example 7, except that in step 4 the host was a 60:40 mixture of NPB and 9-(1-naphthyl)-10-(biphenyl-4-yl)anthracene, and in step 6 the electron-transporting layer comprised a 60:40 mixture of ALQ and 9-(1-naphthyl)-10-(biphenyl-4-yl)anthracene.

Results (Examples 7-12)

The devices were tested as described above for Examples 1-6. The following table shows the results, which were calculated as for Examples 1-6, above. Relative measurements are referred to Example 7, except for relative luminance after aging, in which each example at 500 hours is compared to itself at 0 hours.

TABLE 2

| Example: | 7 | 8 | 9 | 10 | 11 | 12 |
|---|---|---|---|---|---|---|
| Type (Inventive or Comparative) | Comp | Inv | Inv | Inv | Inv | Inv |
| % Mono-anthracene in yellow layer | 0 | 10 | 40 | 0 | 10 | 40 |
| % Mono-anthracene in electron-transporting layer | 0 | 0 | 0 | 10 | 10 | 40 |
| Relative Drive voltage | 1.00 | 1.00 | 1.00 | 0.98 | 0.99 | 1.00 |
| Relative Luminous Efficiency | 1.00 | 1.08 | 1.18 | 1.05 | 1.01 | 1.09 |
| CIE x | 0.25 | 0.25 | 0.26 | 0.25 | 0.25 | 0.26 |
| CIE y | 0.43 | 0.44 | 0.44 | 0.43 | 0.44 | 0.44 |
| CIE change magnitude with respect to the comparison | — | 0.01 | 0.01 | 0.00 | 0.01 | 0.01 |
| CIE x change from 1 to 40 mA/cm$^2$ | 0.02 | 0.02 | 0.025 | 0.02 | 0.03 | 0.03 |
| CIE y change from 1 to 40 mA/cm$^2$ | 0.01 | 0.016 | 0.02 | 0.022 | 0.03 | 0.03 |
| Relative luminance after aging | 72% | 76% | 83% | 74% | 83% | 88% |
| CIE x after aging | 0.25 | 0.25 | 0.28 | 0.25 | 0.26 | 0.30 |
| CIE y after aging | 0.43 | 0.44 | 0.44 | 0.43 | 0.44 | 0.44 |

As can be seen in the above table, the addition of a mono-anthracene derivative to the yellow layer or to the electron-transporting layer, or both, results in improvements in the luminous efficiency and device stability and does not entail an unacceptable color shift as a function of current density. This shows that the mono-anthracene derivative/aromatic amine derivative combination can be used effectively in the yellow light-emitting layer and the electron-transporting layer without being present in the blue light-emitting layer.

Example 13 (Comparative)

A comparative OLED device was constructed in the following manner:
1. A clean glass substrate was vacuum-deposited with ITO to form a transparent electrode of 85 nm thickness;
2. The above-prepared ITO surface was treated with a plasma oxygen etch, followed by plasma deposition of a 0.5 nm layer of $CF_x$;
3. The above-prepared substrate was further treated by vacuum-depositing a 240 nm layer of NPB as a hole-transporting layer (HTL);
4. A 30 nm layer of NPB (as host) with 2.5% 5,11-bis(biphenyl-4-yl)-6,12-bis(4-tert-butylphenyl)-3,9-di-tert-butylnaphthacene (as dopant) was vacuum-deposited onto the substrate at a coating station that included a heated graphite boat source to form a yellow emitting first light-emitting layer (yellow layer);
5. A coating of 40 nm thickness, composed of 94% 9-(1-naphthyl)-10-(biphenyl-4-yl)anthracene, 7% NPB, and 1.0% tetra-t-butylperylene was evaporatively deposited on the above substrate to form a blue emitting second light-emitting layer (blue layer);
6. A 10 nm layer of ALQ was vacuum-deposited onto the substrate at a coating station that included a heated graphite boat source to form an electron-transporting layer;
7. A 1.0 nm layer of lithium fluoride was evaporatively deposited onto the substrate, followed by a 200 nm layer of aluminum, to form a cathode layer; and
8. The device was then transferred to a dry box for encapsulation.

Example 14 (Inventive)

An inventive OLED device was constructed as in Example 13, except that in step 4 the host was 95% NPB and 5% 9-(1-naphthyl)-10-(biphenyl-4-yl)anthracene.

Example 15 (Inventive)

An inventive OLED device was constructed as in Example 13, except that in step 4 the host was 90% NPB and 10% 9-(1-naphthyl)-10-(biphenyl-4-yl)anthracene.

Example 16 (Inventive)

An inventive OLED device was constructed as in Example 13, except that in step 4 the host was 80% NPB and 20% 9-(1-naphthyl)-10-(biphenyl-4-yl)anthracene.

Example 17 (Inventive)

An inventive OLED device was constructed as in Example 13, except that in step 4 the host was 50% NPB and 50% 9-(1-naphthyl)-10-(biphenyl-4-yl)anthracene.

Results (Examples 12-17)

The devices were tested by applying a current across the electrodes of 20 $mA/cm^2$ and measuring the spectrum. The following table shows the results, which were calculated as for Examples 1-6, above. Relative measurements are referred to Example 13. For lifetime, the intensity was monitored as a function of time at a constant current of 80 $mA/cm^2$. The relative lifetime is defined as the time for the luminance of the example device to drop to half of its initial value, divided by the time for the luminance of the reference device of Example 13 to drop to half of its initial value.

TABLE 3

| Example: | 13 | 14 | 15 | 16 | 17 |
|---|---|---|---|---|---|
| Type (Inventive or Comparative) | Comp | Inv | Inv | Inv | Comp |
| % Mono-anthracene in yellow layer | 0 | 5 | 10 | 20 | 50 |
| Relative Drive voltage | 1.00 | 1.02 | 1.03 | 1.04 | 1.03 |
| Relative Luminous Efficiency | 1.00 | 0.99 | 1.01 | 1.02 | 1.05 |
| CIE x | 0.32 | 0.32 | 0.33 | 0.33 | 0.34 |
| CIE y | 0.32 | 0.32 | 0.32 | 0.32 | 0.33 |
| CIE change magnitude with respect to the comparison | — | 0.00 | 0.01 | 0.01 | 0.02 |
| CIE x change from 1 to 40 $mA/cm^2$ | 0.02 | 0.02 | 0.025 | 0.03 | 0.04 |
| CIE y change from 1 to 40 $mA/cm^2$ | 0.01 | 0.016 | 0.02 | 0.022 | 0.03 |
| Time to 50% luminance (hours) | 399 | 530 | 550 | 750 | 650 |
| CIE x after aging | 0.39 | 0.35 | 0.35 | 0.35 | 0.37 |
| CIE y after aging | 0.37 | 0.34 | 0.34 | 0.35 | 0.35 |

Kobori et al. report that changing a magnesium-silver cathode with an alkali metal halide electron-injecting layer to the same electrode without the electron-injecting layer changed the emission color dramatically, from white to orange. Table 3 shows data obtained with an aluminum cathode with an alkali metal halide electron-injecting layer. The previous tables show data obtained with a magnesium-silver electrode without an electron-injecting layer. No dramatic color shift is seen, and the benefit of improved lifetime is preserved.

The invention has been described in detail with particular reference to certain preferred embodiments thereof, but it will be understood that variations and modifications can be effected within the spirit and scope of the invention.

PARTS LIST

10 OLED device
20 substrate
25 color filter
30 anode
35 hole-injecting layer
40 hole-transporting layer
45 light-emitting layer
50 light-emitting layer
55 electron-transporting layer
60 electron-injecting layer
70 organic EL element
90 cathode

The invention claimed is:
1. A white light-emitting OLED device having an anode and a cathode, comprising:
   a) a first light-emitting layer provided over the anode and containing a first host material and a first light-emitting material, wherein the first host material is a mixture of one or more mono-anthracene derivatives and one or more aromatic amine derivatives, wherein the mono-anthracene derivative(s) being provided in a volume fraction range of 5% to 50% relative to the total host volume, and the aromatic amine derivative(s) being provided in a volume fraction range of 50% to 95% relative to the total host volume, and wherein the first light-emitting material has a peak emission in the yellow to red portion of the spectrum; and b) a second light-emitting layer provided over or under the first light-emitting layer, wherein the second light-emitting layer has a peak emission in the blue to cyan portion of the spectrum, whereby white light is produced by the OLED device.

2. The white light-emitting OLED of claim 1 wherein the second light-emitting layer contains a second host material and a second light-emitting material, wherein the second host material includes one or more mono-anthracene derivatives.

3. The white light-emitting OLED of claim 2 wherein the same mono-anthracene derivative(s) are used in the first and second host materials.

4. The white light-emitting OLED of claim 2 wherein at least one of the mono-anthracene derivatives of the first or second host materials includes:

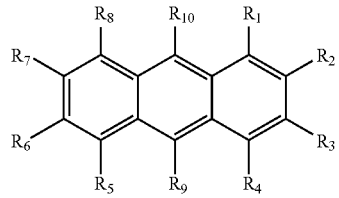

wherein:
$R_1$-$R_8$ are H;
$R_9$ is not the same as $R_{10}$;
$R_9$ is a naphthyl group having no fused rings with aliphatic carbon ring members; and
$R_{10}$ is a biphenyl group having no fused rings with aliphatic carbon ring members; and
provided that $R_9$ and $R_{10}$ are free of amino and sulfur substituents.

5. The white light-emitting OLED of claim 2 wherein at least one of the mono-anthracene derivatives of the first or second host materials includes:

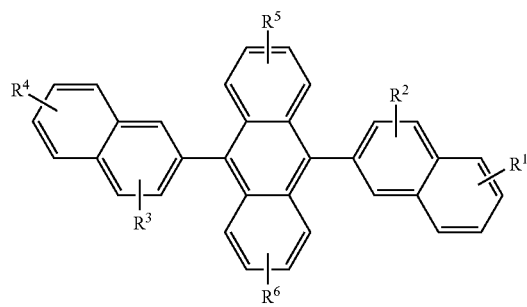

wherein $R^1$, $R^2$, $R^3$, $R^4$, $R^5$, and $R^6$ represent one or more substituents on each ring and each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

6. The white light-emitting OLED of claim 2 wherein the second host material further includes one or more aromatic amine derivatives wherein the mono-anthracene derivative (s) being provided in a volume fraction of greater than 85% and less than 100% relative to the total host volume, and the aromatic amine derivative(s) being provided in a volume fraction of greater than 0% and less than 15%.

7. The white light-emitting OLED of claim 6 wherein the same aromatic amine derivative(s) are used in the first and the second host materials.

8. The white light-emitting OLED of claim 1 wherein the first light-emitting material is [a} selected from:

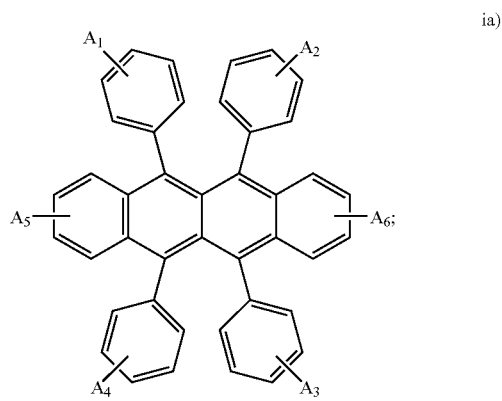

wherein for structure ia), $A_1$-$A_6$ represent one or more substituents on each ring and where each substituent is individually selected from one of the following:
Category 1: hydrogen, or alkyl of from 1 to 24 carbon atoms;
Category 2: aryl or substituted aryl of from 5 to 20 carbon atoms;
Category 3: hydrocarbon containing 4 to 24 carbon atoms, completing a fused aromatic ring or ring system;
Category 4: heteroaryl or substituted heteroaryl of from 5 to 24 carbon atoms including thiazolyl, furyl, thienyl, pyridyl, quinolinyl or other heterocyclic systems, which are bonded via a single bond, or complete a fused heteroaromatic ring system;
Category 5: alkoxylamino, alkylamino, or arylamino of from 1 to 24 carbon atoms; or
Category 6: fluoro, chloro, bromo or cyano.

9. The white light-emitting OLED of claim 2 wherein the second light-emitting material is selected from a derivative of perylene.

10. The white light-emitting OLED of claim 2 further including an organic layer disposed over the first and second light-emitting layers, wherein the organic layer includes an electron-transporting material and a mono-anthracene derivative, and wherein the mono-anthracene derivative is present in an amount up to 50% by volume of the organic layer.

11. The white light-emitting OLED of claim 10 wherein the organic layer includes a light-emitting material, thereby providing a third light-emitting layer.

12. The white light-emitting OLED of claim 11 wherein the third light-emitting layer has a peak emission in the yellow to green portion of the spectrum.

* * * * *

UNITED STATES PATENT AND TRADEMARK OFFICE
CERTIFICATE OF CORRECTION

PATENT NO. : 7,288,330 B2
APPLICATION NO. : 10/882834
DATED : October 30, 2007
INVENTOR(S) : Tukaram K. Hatwar et al.

It is certified that error appears in the above-identified patent and that said Letters Patent is hereby corrected as shown below:

Title page, column 1, Item (73) Assignee    "Assignee: Eaastman Kodak Company" should read --Assignee: Eastman Kodak Company--

Column 48, Claim 8, line 15    Delete "[a}"

Signed and Sealed this

Tenth Day of June, 2008

JON W. DUDAS
*Director of the United States Patent and Trademark Office*